United States Patent [19]
Taniguchi et al.

[11] Patent Number: 5,760,544
[45] Date of Patent: Jun. 2, 1998

[54] MAGNETRON MICROWAVE GENERATOR WITH FILAMENT-LIFE DIAGNOSTIC CIRCUIT

[75] Inventors: Michio Taniguchi; Hiroaki Oichi, both of Kobe; Yoshiki Fukumoto, Kishiwada; Daisuke Matsuno, Kobe; Yoshinobu Kasai, Osaka, all of Japan

[73] Assignee: Daihen Corporation, Osaka, Japan

[21] Appl. No.: 803,546

[22] Filed: Feb. 20, 1997

[30] Foreign Application Priority Data

May 31, 1996 [JP] Japan .................. 8-160759

[51] Int. Cl.$^6$ ............................................. G01R 31/25
[52] U.S. Cl. .................... 315/39.51; 324/405; 324/409
[58] Field of Search ................... 315/39.51; 324/403, 324/405, 409

[56] References Cited

U.S. PATENT DOCUMENTS 2,967,996  1/1961  Bradford .................. 324/409 X
5,565,781  10/1996  Dauge ..................... 324/403

*Primary Examiner*—Robert Pascal
*Assistant Examiner*—Justin P. Bettendorf
*Attorney, Agent, or Firm*—Scully, Scott, Murphy & Presser

[57] ABSTRACT

The microwave generator with use of a magnetron comprises a microwave detector for detecting microwave output from the magnetron and a filament life diagnostic circuit for judging the life of filament of the magnetron by decreasing an input power to a filament of the magnetron from a normal state of the magnetron while monitoring the microwave output from the magnetron by the microwave detector, comparing the input power in the normal state of the magnetron with that just before the magnetron becomes unstable and judging the filament life based on the difference between the input power of the normal state and that just before the unstable state.

4 Claims, 4 Drawing Sheets

5,760,544

MAGNETRON MICROWAVE GENERATOR WITH FILAMENT-LIFE DIAGNOSTIC CIRCUIT

BACKGROUND OF THE INVENTION

1. Field of the Invention

The present invention relates to a microwave generator having a magnetron filament life diagnostic circuit.

2. Description of the Prior Art

Microwave generated plasma is often used in a CVD system for forming thin films and in a plasma processing system such as a plasma etching system. These systems each have a microwave generator which includes a magnetron for generating microwave, an anode power supply for providing power between its filament and its anode, and a filament power supply for providing power to the filament.

The magnetron used for a microwave generator is expendable; when it approaches the end of its life, its output becomes low and unstable; and it finally ceases generating microwave. A plasma processing system for processing wafers particularly, needs a stable microwave output and, hence, the magnetron must be replaced before its output becomes unstable.

Typically magnetrons are replaced when the accumulated filament operation time reaches the time recommended by its manufacturer. Therefore, magnetrons are often replaced before their life span is over resulting in a higher operating costs. Sometimes magnetrons are used past the recommended accumulated operating time in order to reduce operating costs and they are replaced when their output starts to decrease. In this case, because the magnetrons are replaced after their life span is over, the plasma processes are unstable and wafers are not properly processed.

SUMMARY OF THE INVENTION

An essential object of the present invention is, therefore, to provide a microwave generator which determines the life of the magnetron filament, indicates the time of replacement, and accordingly prolongs the useful time of the magnetron.

The present invention relates to a microwave generator comprising a magnetron for generating microwave, an anode power source for supplying a power between the filament and anode of the magnetron, a filament power source for supplying a power to the filament of the magnetron, and a microwave output setting means for obtaining a desired microwave output power by an anode current flowing between the filament and anode, the microwave generator further comprising (a) a filament input setting means for obtaining a desired filament input by regulating an output of the filament power source; (b) a microwave output state detector for detecting a microwave output state of the magnetron; and (c) a filament life diagnostic circuit for judging the life of the filament of the magnetron, the filament life diagnostic circuit comprising (c-1) a microwave output status judging section for judging whether the microwave output power is stable or not based on the output from the microwave power detector, (c-2) a filament input regulation value memory section for storing a filament input value as a filament input regulation value, the filament input value corresponding to an arbitrary microwave output value based on a relationship predetermined between the microwave output and the filament input, (c-3) a filament input set value variation section for decreasing the filament input set value set at the filament input setting means, (c-4) a filament input set value memory section for storing a minimum filament input set value obtained during the microwave output has been judged stable before being judged to be unstable by the microwave output power judging section, in a state that the filament input regulation value is set at the filament input setting means and the microwave output value at a timing when said regulation value was selected, while lowering the filament input set value by the filament input set value variation section, and (c-5) a filament input operation section for calculating a filament input value difference between the filament input set value stored in said filament input set value memory section and the filament input regulation value stored in the filament input regulation value memory section, and wherein the filament file diagnostic circuit judges the life of the filament of the magnetron based on the filament input value difference.

The filament life diagnostic circuit of the present invention determines the life of the filament of the magnetron based on the filament input value difference.

Most magnetrons reduce their microwave output power as they are used and eventually cease to operate because the number of thermal electrons emitted from the filament decreases. The number of thermal electrons emitted from the filament depends on the state of the filament surface which degrades as the filament is used. After long use the filament can no longer emit enough thermal electrons. Conversely, the filament which has been used for only a short time does not exhibit significant degradation and hence emits a sufficient number of thermal electrons. The number of thermal electrons emitted from a filament also depends on the input to the filament.

If the degradation of the filament surface is not significant, the filament can emit enough thermal electrons to obtain a sufficient anode current for a filament input which is lower than the specified value, and the stable operation of the magnetron results. If the filament input is too low, the output of the magnetron becomes unstable. If the degradation of the filament is significant, a filament input lower than the specified value does not produce enough thermal electrons to generate a stable microwave output power. An elevated filament input, however, can generate a stable microwave output power.

At an inspection the filament input value difference is calculated between the starting filament input value stored in the starting filament input value storage portion and the minimum filament input value stored in the minimum filament input value storage portion, where the minimum filament input value is defined as the lowest filament input value which keeps the microwave output power stable as the filament input value is decremented. This difference is a measure of the remainder of the life of the filament: that is, a larger difference means a lesser degradation of the filament surface and a smaller difference means a greater degradation.

The microwave generator of the present invention includes a filament life diagnostic circuit comprising a magnetron for generating microwave, an anode power source for supplying a power between the filament and anode of the magnetron, a filament power source for supplying a power to the filament of the magnetron, and a microwave output setting means for obtaining a desired microwave output power by an anode current flowing between the filament and anode, the microwave generator further comprising (a) a filament input setter for obtaining a desired filament input by regulating an output of the filament power source, (b) a microwave output detector for detecting a microwave output power of the magnetron, and (c) a filament life diagnostic circuit for judging the life of the filament of the magnetron, the filament diagnostic circuit comprising (c-1) a microwave output variation judging section for judging whether the rate of change in the microwave output power from the microwave output detector is zero or not, (c-2) a microwave output regulation value memory section for storing an arbitrary microwave output value as a regulation value, (c-3) a microwave output set value variation section for increasing the microwave output set value set at the microwave output setting means, (c-4) a microwave output set value memory section for storing a maximum microwave output set value obtained during the rate of change in the microwave output is judged to be not zero by the microwave output variation judging section before the rate of change in the microwave output became zero while increasing the microwave output set value by the microwave output set value variation section in a state that the regulation value is set at the microwave output setting means and a filament input value corresponding to the regulation value taking a relationship predetermined between the microwave output and filament input, and (c-5) a microwave output difference operation section for calculating a microwave output value difference between the microwave output set value stored in the microwave output set value memory section and the microwave output regulation value stored in the microwave output regulation value memory section, wherein the filament life diagnostic circuit judges the life of the filament of the magnetron based on the microwave output value difference.

The filament life diagnostic circuit of this claim determines the life of the filament of the magnetron based on the microwave output power value difference.

The anode current is proportional to the number of thermal electrons emitted from the filament. Therefore, if the surface of the filament is not substantially degraded, enough thermal electrons are available to produce a large anode current or high microwave output power. If the surface of the filament is substantially degraded, however, enough thermal electrons are not available to produce a large anode current. Thus less microwave output power is generated in this case than in the case in which the filament surface is less degraded.

At an inspection, the microwave output power value difference is calculated between the starting microwave output power value stored in the starting microwave output power value storage portion and the maximum microwave output power value stored in the maximum microwave output power value storage portion, where the maximum microwave output power value is defined as the highest microwave output power value which will maintain the differential microwave output power to be non-zero as the microwave output power value is incremented. This difference is a measure of the remainder of the life of the filament: that is, a larger difference means a lesser degradation of the filament surface and a smaller difference means a greater degradation.

The microwave generator in which the filament life diagnostic circuit further comprises a replacement time setting section for presetting a time limit value for replacement of the magnetron, a comparison section for comparing the life of the filament judged by the filament life diagnostic circuit with the preset time limit, and a warning section for instructing the replacement of magnetron to users when the life of the filament expired on or before the preset time limit.

At an inspection the filament input value difference or the microwave output power value difference (simply referred to as the difference in this paragraph) is compared with the replacement time value of the magnetron. If the difference is less than the replacement time value, the magnetron must be replaced, and this replacement occurs before the magnetron reaches the end of its life. If the difference is greater than the replacement time value, the difference subtracted by the replacement time value can be displayed. This value is a measure of the time period after which the magnetron must be replaced. A small value means that the magnetron must be replaced soon. Thus, setting the replacement time number at a small value allows the magnetron to be replaced almost at the end of its life.

BRIEF DESCRIPTION OF THE DRAWINGS

The present invention will become more fully understood from the detailed description given below and the accompanying diagrams wherein.

DESCRIPTION OF PREFERRED EMBODIMENTS

The preferred embodiments of the present invention are described below with reference to the accompanying figures.

Embodiment 1

Figure 1:
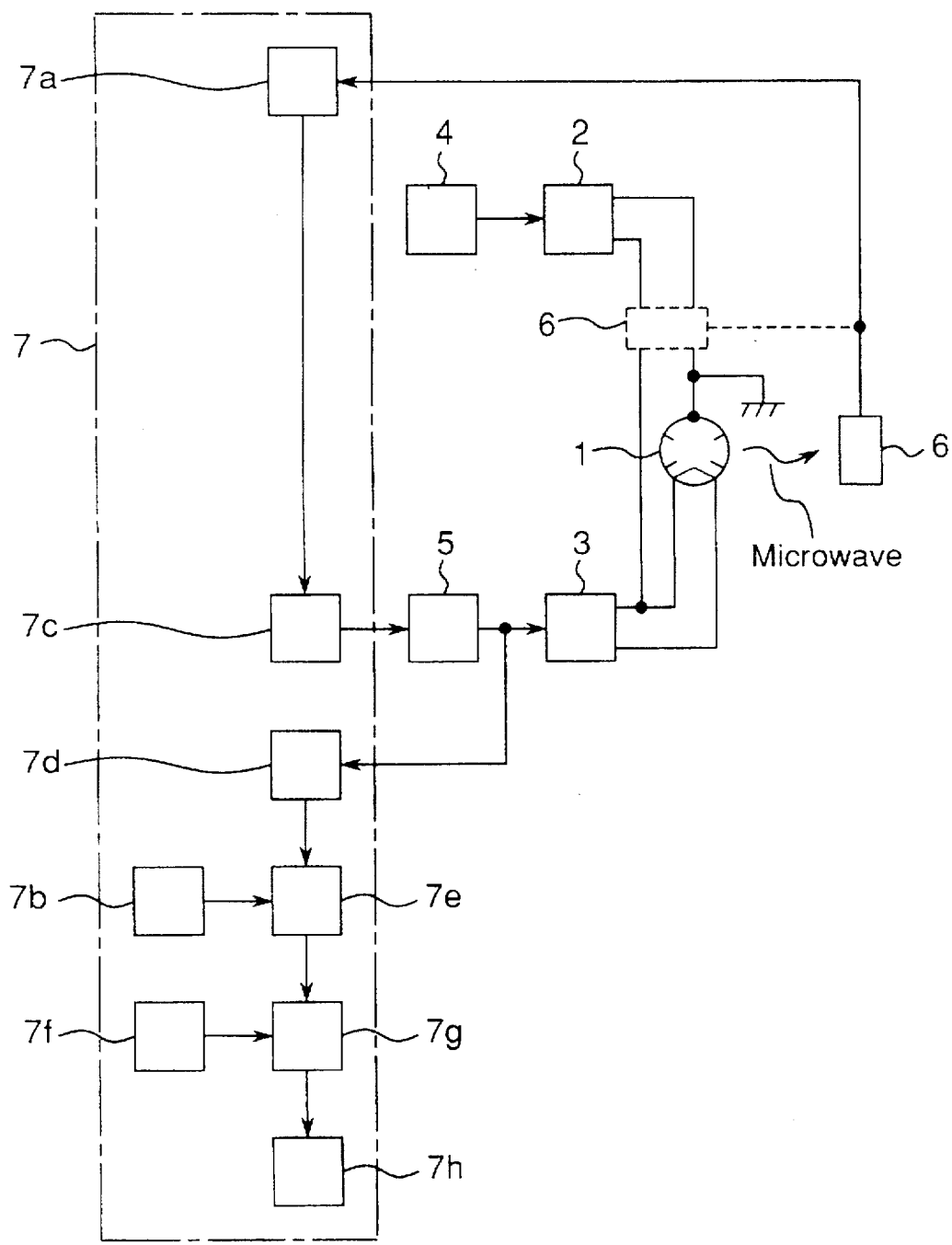
FIG. 1 shows a block diagram of the microwave generator of Embodiment 1 of the present invention.

FIG. 1 shows a block diagram of the microwave generator of Embodiment 1 of the present invention. With reference to FIG. 1, the numeral 1 denotes a magnetron for generating microwaves 2, an anode power source to supply power between the filament and the anode of the magnetron 1; 3, a filament power source to supply power to the filament of the magnetron 1; 4, a microwave output setting means for obtaining a desired microwave output power by changing the anode current flowing between the filament and the anode of the magnetron 1; 5, a filament input setting means for obtaining a desired filament input, such as filament voltage, filament current or filament power, provided by the filament power supply 3; and 6, a microwave output state detector to detect the microwave output state; and 7, a filament life diagnostic circuit for determining the life of the magnetron and for indicating the need for replacement.

The filament life diagnostic circuit 7 includes a microwave output status judging section 7a which receives an output from the microwave output state detector 6 and judges whether the microwave output is stable or not; a filament input regulation value memory section 7b which stores a nominal filament input value needed to obtain any desired microwave output power as a filament input regulation value; and a filament input set value variation section 7c; which stores a program to decrease the filament set input value provided to the filament input setting means 5. The filament life diagnostic circuit 7 also includes a filament input set value memory section 7d for storing the minimum filament input set value which keeps the microwave output stable as the filament input set value provided to the filament input setting means is decreased from a starting filament input set value by the filament input set value variation section until the microwave output status judging section 7a determines that the microwave output is unstable; and a filament input difference operation section 7e which calculates the difference between the minimum filament input set value stored in the minimum filament input set value section 7d and the filament input regulation value stored in the filament input regulation value memory section 7b. The filament life diagnostic circuit 7 further includes a replacement time setting section 7f which presets the replacement time limit value of the magnetron 1; a comparison section 7g which compares the value calculated by the filament input difference operation section 7e with the replacement time limit value set at the replacement time setting section 7f; and an alarm section 7h which produces an audio or visual alarm to indicate the need for replacement of the magnetron 1 depending upon the result of the comparison performed at the comparison section 7g.

The filament life diagnostic circuit 7 receives outputs from the filament input setting means 5 and the microwave output state detector 6. The microwave output state detector 6 obtains a ripple current of the output from a microwave detecting circuit or from a microwave power meter connected to a directional coupler (not shown) which is attached to a wave guide connecting the microwave generator with a load. The microwave output state detector 6 will detect a ripple current when the microwave output is unstable because the ripple current is superimposed on the microwave output, whereas it will not detect a ripple current when the microwave output is stable because a ripple current does not exist.

In order to set up the filament life diagnostic circuit 7 of the microwave generator with the aforementioned configuration, which is normally done at an inspection, first, a filament input value necessary to obtain a desired microwave output power is determined by referring to the curve which relates the microwave output power to the filament input of the particular magnetron used, and the obtained value is input to the filament input setting means 5 as a filament input regulation value (denoted as FR). Next, the desired microwave output power, corresponding to the FR, is input to the microwave output setting means 4. Then, the values set in the setting means 4 and 5 are transferred to the anode power source 2 and the filament power source 3 respectively in order to generate microwave.

Now, the filament input set value (F=FR) provided to the filament input setting means 5 is decreased from FR following the program stored in the filament input set value variation section 7c until the microwave output status judging section 7a determines the microwave output to be unstable. The minimum filament input set value (F=F1) which keeps the microwave output stable is determined and stored in the filament input set value memory section 7d. The filament input difference operation section 7e calculates the difference between the minimum filament input set value F1 and the filament input regulation value FR stored in the filament input regulation value memory section 7b to obtain FX=FR−F1.

At the next inspection the microwave output and the corresponding filament input regulation value are set at the same values as those of the previous inspection. Then the filament input set value F is decreased as before from the filament input regulation value FR until the microwave output is determined to be unstable. The minimum filament input set value (F=F2) which keeps the microwave output stable is determined and stored. Then the difference FX between the minimum filament input set value F2 and the filament input regulation value FR (FX=FR−F2) is calculated.

The minimum filament input set value F0 at the initial set up is smaller than any other minimum values determined at the later set up because the filament of the magnetron at the initial set up has no degradation. Thus the difference FX at the initial setup is the largest. Since the filament of the magnetron degrades as it is used, one obtains the inequality, F0<F1<F2< . . . . Accordingly, the FX decreases as time passes and eventually becomes zero when the filament reaches the end of its life. Conversely, the fact that the FX is zero means that the filament has reached the end of its life. Therefore, the difference FX is considered to be a measure of the remaining life of the filament.

A value referred to as the replacement time limit value FS can be defined. The FS is compared with FX. The audio or visual alarm for replacement of the magnetron can be designed to go off when the FX is less than or equal to the FS.

The replacement time limit value FS is determined based on the filament input difference FX. Typically, manufacturers of magnetrons recommend replacement of a magnetron when the accumulated operating time of the filament of the magnetron reaches 2,000 hours regardless of the condition in which the magnetron is used. Therefore, the replacement time of a magnetron according to the present invention must exceed 2,000 hours. An estimate of the FS value is obtained by calculating the FX value when accumulated operating time of the magnetron reaches 2,000 hours. The FX value thus obtained, however, will depend upon the condition in which the magnetron is used. The degradation of the filament is greater when the magnetron is used with a large microwave output power than when it is used with a small microwave output power. Therefore the FX values for the above two cases after long operating hours are different. Thus, in order to obtain the proper FS value, one obtains the FX value experimentally after 2,000 hours of operation under the most severe conditions and sets the FS value at a smaller value than the FX thus obtained, preferably at a value close to zero. If the FS value is too close to zero or if the interval between inspections is too long, the magnetron may reach the end of its life during the operation. This situation can be avoided by setting the FS at a value large enough and/or making the interval between inspections shorter. It should be noted that different kinds of magnetrons must have different FS values.

Figure 2:
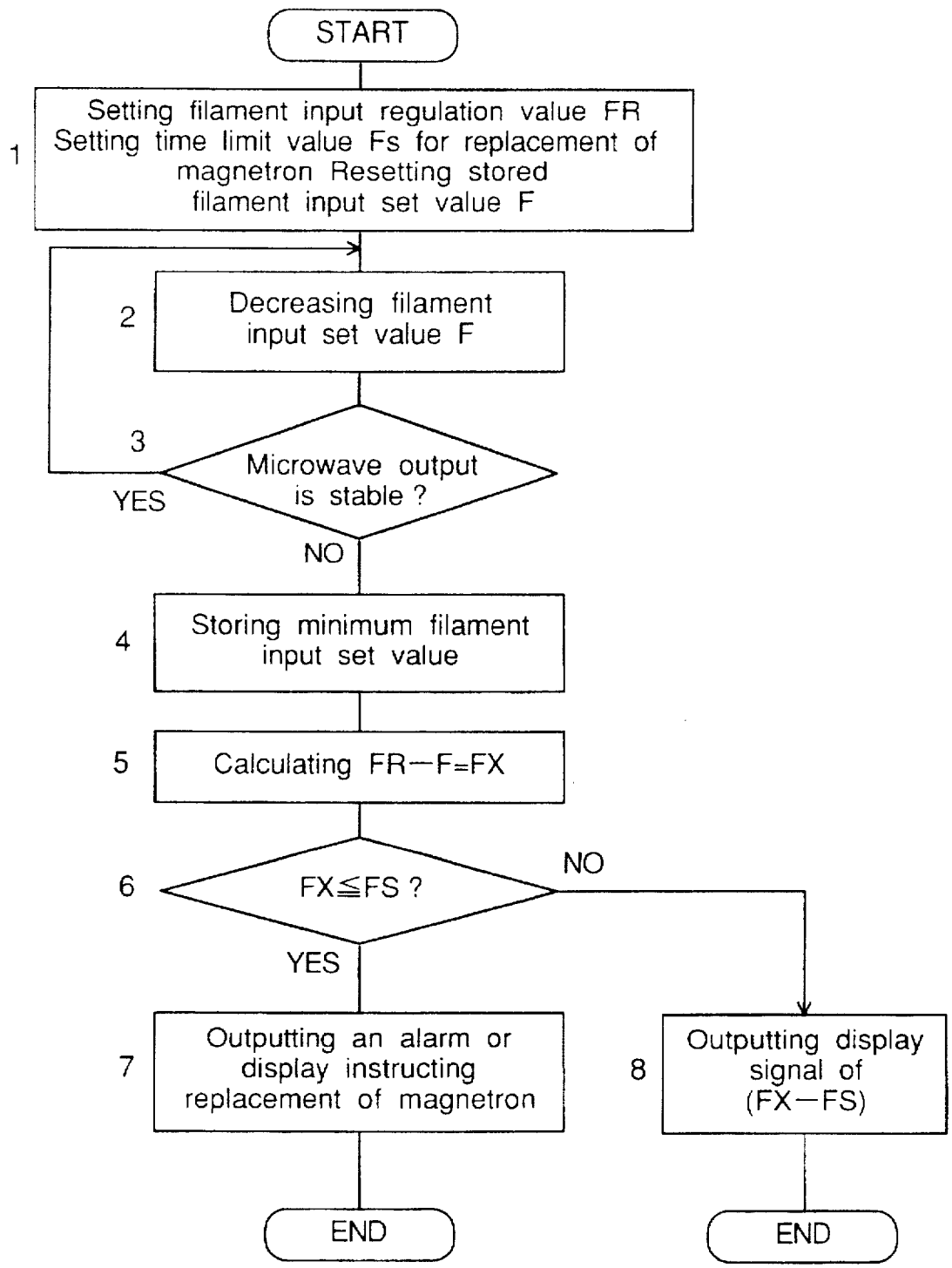
FIG. 2 shows a flow chart of the algorithm of a program the computer performs in the filament life diagnostic circuit 7 of Embodiment 1.

FIG. 2 shows a flow chart of the algorithm of a program the computer performs in the filament life diagnostic circuit 7.

With reference to the algorithm shown in FIG. 2, first the initialization is performed in which a filament input regulation value FR is input into the filament input setting means 5 and the filament input regulation value memory section 7b; the replacement time limit value FS for the magnetron in use is input into the replacement time setting section 7f; and the filament input set value F stored in the minimum filament input set value memory section 7d is reset (Step 1).

Next, the filament input set value variation section 7c issues a command to the filament input setting means 5 to decrease the filament input set value F from the FR value which has initially been set (Step 2).

Next, the microwave output status judging section 7a determines whether the microwave output power is stable or not (Step 3).

In a case in which the microwave output is determined to be stable the system goes back to Step 2 where the filament input set value variation section 7c issues another command to the filament input setting means 5 to further decrease the filament input set value F. While the microwave output is determined to be stable, this repetition continues (repetition of Steps 2 and 3).

When the microwave output (power) is determined to be unstable in Step 3, the minimum filament input set value F which kept the microwave output to be stable is stored as the filament input set value in the filament input set value memory section 7d (Step 4).

The filament input value difference FX between the minimum filament input set value F and the filament input regulation value FR stored in the filament input regulation value memory section 7b is calculated. Since FR is always larger than F, the operation of (FR–F) is performed (Step 5).

Next, the calculated value FX and the replacement time limit value FS are compared (Step 6). If FX≦FS, an alarm or display instructing the replacement of the magnetron is made (Step 7). If FX>FS, a signal representing the value of (FX–FS) may be output for display (Step 8).

Performing Steps 1–5, the filament life diagnostic circuit 7 can determine the remainder of the life of the magnetron. Further, Steps 6 and 7 in addition to Steps 1–5 allow for the alarm and/or display functions for replacement of the magnetron.

Embodiment 2

Figure 3:
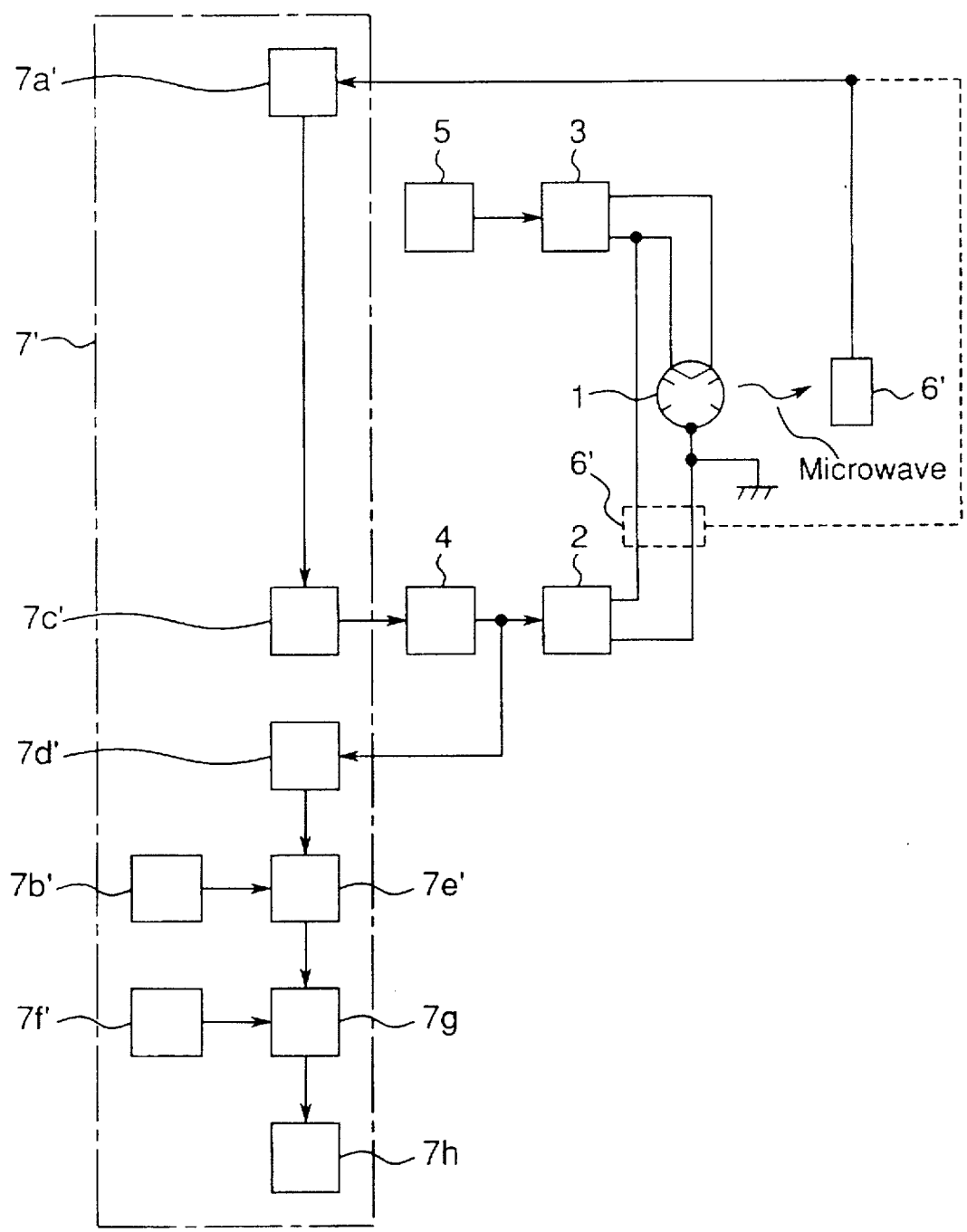
FIG. 3 shows a block diagram of the microwave generator of Embodiment 2 of the present invention.

FIG. 3 shows a block diagram of the microwave generator of Embodiment 2 of the present invention. With reference to FIG. 3, the numeral 1 denotes a magnetron for generating microwave; 2, an anode power source to provide power between the filament and the anode of the magnetron 1; 3, a filament power source to provide power to the filament of the magnetron 1; 4, a microwave output setting means for obtaining a desired microwave output power by changing the anode current flowing between the filament and the anode of the magnetron 1; 5, a filament input setting means for obtaining a desired filament input, such as filament voltage, filament current or filament power, provided by the filament power supply 3; and 6', a microwave output detector to detect the microwave output power; and 7', a filament life diagnostic circuit for determining the life of the magnetron and for indicating the need for replacement.

The filament life diagnostic circuit 7' includes a microwave output variation judging section 7a' which receives an output from the microwave output detector 6' and judges whether the rate of change in the microwave output power (herein after, referred to as the differential microwave output power) is zero or not; a starting microwave output regulation value memory section 7b' which stores an arbitrary microwave output power as a regulation value; and a microwave output set value variation section 7c' which stores a program to increase the microwave output set value set at the microwave output setting means 4. The filament life diagnostic circuit 7' also includes a microwave output set value memory section 7d' which stores the maximum microwave output set value which produces non-zero microwave output power when the microwave output variation judging section 7a' determines that the differential microwave output power is zero; and a microwave output difference operation section 7e' which calculates the difference between the maximum microwave output set value stored in the microwave output set value memory section 7d' and the microwave output regulation value stored in the microwave output regulation value memory section 7b'. The filament life diagnostic circuit 7' further includes a replacement time setting section 7f which stores the preset replacement time limit value of the magnetron 1; a comparison section 7g' which compares the value calculated by the microwave output difference operation section 7e' with the replacement time limit value stored at the replacement time limit setting section 7f; and an alarm section 7h which produces an audio or visual alarm for replacement of the magnetron 1 in use depending upon the result of the comparison performed at the comparison section 7g.

The filament life diagnostic circuit 7' receives outputs from the microwave output setting means 4 and the microwave output detector 6'. The microwave output detector 6' includes a microwave detecting circuit or a microwave power meter connected to a directional coupler (not shown) which is attached to a wave guide connecting the microwave generator with a load.

In order to set up the filament life diagnostic circuit 7' of the microwave generator with the aforementioned configuration, which is normally done at an inspection, first, a desired microwave output power (referred to as a microwave output regulation value AR) is input to the microwave output setting means 4. Next, the filament input value corresponding to that microwave output regulation value AR is input to the filament input setting means 5 by referring to the curve which relates the microwave output power to the filament input value of the particular magnetron used. Then, the values set in the setting means 4 and 5 are transferred to the anode power source 2 and the filament power source 3 respectively in order to generate microwave.

The microwave output regulation value (A=AR) provided to the microwave output setting means 4 is now increased from AR following the program stored in the microwave output set value variation section 7c' until the microwave output variation judging section 7a' determines that the differential microwave output power is zero. The maximum output set value (A=A1) which maintained the differential microwave output power to be non-zero is determined and stored in the microwave output set value memory section 7d'. The microwave output difference operation section 7e' calculates the difference between the maximum microwave output set value A1 and the microwave output regulation value AR stored in the microwave output regulation value memory section 7b' to obtain AX=A1−AR.

At the time of the next inspection the filament input value and the corresponding microwave output variation value are set at the same values as those of the previous inspection. Then the microwave output power is increased from the microwave output regulation value AR as before until the differential microwave output power is determined to be zero. The maximum microwave output set value (A=A2) which maintained the differential microwave output power to be non-zero is determined and stored. Then the difference AX between the maximum microwave output set value A2 and the microwave output regulation value AR (AX=A2−AR) is calculated.

The maximum microwave output set value A0 at the initial set up is larger than any other maximum microwave output set values determined at the later setting because the filament of the magnetron at the initial setting has no degradation. Thus the difference AX at the initial setting is the largest. Since the filament of the magnetron degrades as it is used, one obtains the inequality, A0>A1>A2 . . . . Accordingly, the AX decreases as time passes and eventually becomes zero when the filament reaches the end of its life. Conversely, the fact that the AX is zero means that the filament has reached the end of its life. Therefore, the difference AX is considered to be a measure of the remaining life of the filament.

A value referred to as the replacement time limit value AS can be defined. The AS is compared with AX. The audio or visual alarm for replacement of the magnetron can be designed to go off when the AX is less than or equal to the AS.

The replacement time limit value AS is determined based on the microwave output difference AX. Typically, manufacturers of magnetrons recommend replacement of a magnetron when the accumulated operating time of the filament of the magnetron reaches 2,000 hours regardless of the conditions under which the magnetron is used. Therefore, the replacement time for a magnetron according to the present invention must exceed 2,000 hours. An estimate of the AS value is obtained by calculating the AX value when the accumulated operating time of the magnetron reaches 2,000 hours. The AX value thus obtained, however, will depend upon the conditions under which the magnetron is used. The degradation of the filament is greater when the magnetron is used with a large microwave output power than when it is used with a small microwave output power. Therefore the AX values for the above two cases after long operating hours are different. Thus, in order to obtain the proper AS value, one experimentally obtains the AX value after 2,000 hours of operation under the most severe conditions and sets the AS value at a smaller value than the AX thus obtained, preferably at a value close to zero. If the AS value is too close to zero or if the interval between inspections is too long, the magnetron may reach the end of its life during operation. This situation can be avoided by setting the AS at a value large enough and/or by making the interval between inspections shorter. It should be noted that different kinds of magnetrons must have different AS values.

Figure 4:
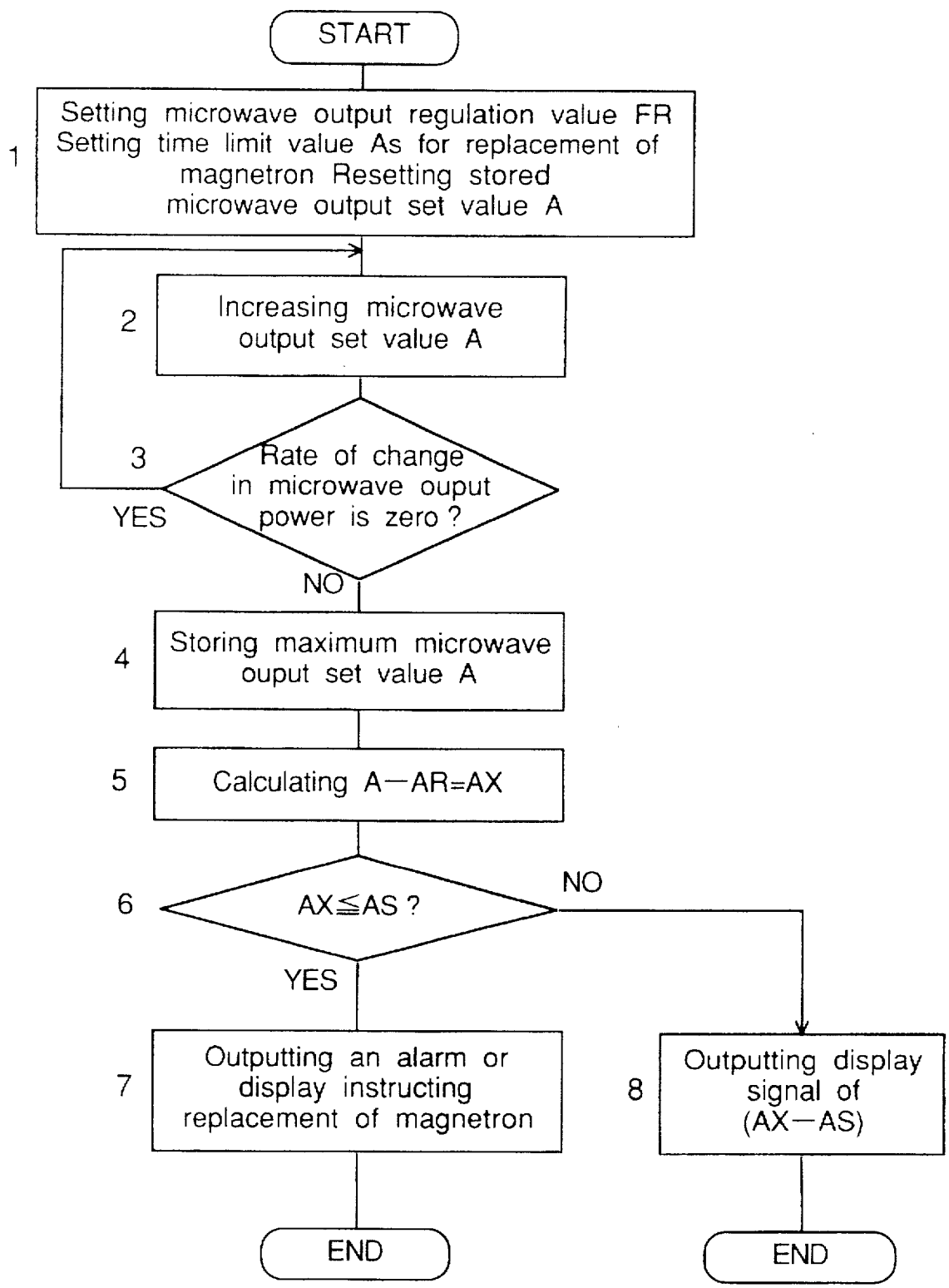
FIG. 4 shows a flow chart of the algorithm of a program the computer performs in the filament life diagnostic circuit 7' of Embodiment 2.

FIG. 4 shows a flow chart of the algorithm of a program the computer performs in the filament life diagnostic circuit 7'.

With reference to the algorithm shown in FIG. 4, first, the initialization is performed where a starting microwave output regulation value AR is input into the microwave output setting means 4 and the microwave output regulation value memory section 7b'; the replacement time limit value AS for the magnetron is input into the replacement time setting section 7f; and the maximum microwave output set value A stored in the maximum microwave output set value memory section 7d is reset (Step 1).

Next, the microwave output set value variation section 7c' issues a command to the microwave output setting means 4 to increase the microwave output set value A from the AR value which was set initially (Step 2).

Next, the microwave output variation judging section 7a' determines whether the differential microwave output power is zero or not (Step 3).

In a case in which the differential microwave output power is determined to be non-zero the system goes back to Step 2 where the microwave output set value variation section 7c' issues another command to the microwave output setting means 4 to further increase the microwave output set value A. While the differential microwave output power is determined to be non-zero, this repetition continues (Repetition of Steps 2 and 3).

When the differential microwave output power is determined to be zero in Step 3, the maximum microwave output set value A which maintained the differential microwave output power to be non-zero is stored as the microwave output set value in the microwave output power value memory section 7d (Step 4).

The microwave output difference AX between the maximum microwave output set value A and the microwave output regulation value AR stored in the microwave output regulation value memory section 7b' is calculated. Since AR is always smaller than A, the operation of (A−AR) is performed (Step 5).

Next, the calculated value AX and the replacement time limit value AS are compared (Step 6). If AX≦AS, an alarm or display instructing the replacement of the magnetron is made (Step 7). If AX>AS, a signal representing the value of (AX−AS) may be output for display (Step 8).

Performing Steps 1–5, the filament life diagnostic circuit 7' can determine the remaining life of the magnetron. Further, Steps 6 and 7 in addition to Steps 1–5 allow for the alarm and/or display functions for replacement of the magnetron.

The microwave output state detector 6 used in Embodiment 1 may be placed between the magnetron 1 and the anode power supply 2. In this case the filament life diagnostic circuit 7 obtains ripple signals from the anode current, anode voltage, or anode power. The microwave output detector 6' used in Embodiment 2 may be placed between the magnetron 1 and the anode power supply 2. In this case the filament life diagnostic circuit 7' detects the anode current or the anode power.

The present invention provides a microwave generator which determines, at an inspection, whether the life of the magnetron filament used in the microwave generator is adequate or not. Therefore, using these microwave generators one can replace the magnetron during an inspection and before it reaches the end of its life.

The microwave generator of the present invention allows one to replace a magnetron just before it reaches the end of its life. Therefore, one can avoid wasting magnetrons which are still usable and can perform stable plasma processes on wafers.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A microwave generator comprising a magnetron for generating microwave, an anode power source for supplying a power between the filament and anode of said magnetron, a filament power source for supplying a power to the filament of said magnetron, and a microwave output setting means for obtaining a desired microwave output power by an anode current flowing between said filament and anode, said microwave generator further comprising:

(a) a filament input setting means for obtaining a desired filament input by regulating an output of said filament power source;
   (b) a microwave output state detector for detecting a microwave output state of said magnetron; and
   (c) a filament life diagnostic circuit for judging the life of the filament of said magnetron, said filament life diagnostic circuit comprising:

(c-1) a microwave output status judging section for judging whether the microwave output state is stable or not based on the output from said microwave power detector;
   (c-2) a filament input regulation value memory section for storing a filament input value as a filament input regulation value, said filament input value corresponding to an arbitrary microwave output value based on a relationship predetermined between the microwave output power and the filament input;
   (c-3) a filament input set value variation section for decreasing the filament input set value set at said filament input setting means;
   (c-4) a filament input set value memory section for storing a minimum filament input set value obtained during the microwave output has been judged stable before being judged to be unstable by said microwave output state judging section while decreasing said filament input set value by said filament input set value variation section in a state that the filament input regulation value is set at said filament input setting means and the microwave output value at a timing when said regulation value was selected; and (c-5) a filament input difference operation section for calculating a filament input value difference between the filament input set value stored in said filament input set value memory section and the filament input regulation value stored in said filament input regulation value memory section; and wherein said filament life diagnostic circuit judges the life of the filament of said magnetron based on said filament input value difference.

2. The microwave generator according to claim 1 in which said filament life diagnostic circuit further comprises:

a replacement time setting section for presetting a time limit value for replacement of said magnetron;

a comparison section for comparing the life of the filament judged by said filament life diagnostic circuit with said preset time limit; and a warning section for instructing the replacement of magnetron to users when the life of the filament expired on or before the preset time limit.

3. A microwave generator comprising a magnetron for generating microwave, an anode power source for supplying a power between the filament and anode of said magnetron, a filament power source for supplying a power to the filament of said magnetron, and a microwave output setting means for obtaining a desired microwave output power by an anode current flowing between said filament and anode, said microwave generator further comprising:

(a) a filament input setting means for obtaining a desired filament input by regulating an output of said filament power source;

(b) a microwave output detector for detecting a microwave output power of said magnetron; and (c) a filament life diagnostic circuit for judging the life of the filament of said magnetron, said filament diagnostic circuit comprising:

(c-1) a microwave output variation judging section for judging whether the rate of change in the microwave output power from said microwave output detector is zero or not;

(c-2) a microwave output regulation value memory section for storing an arbitrary microwave output value as a regulation value;

(c-3) a microwave output set value variation section for increasing the microwave output set value set at said microwave output setting means;

(c-4) a microwave output set value memory section for storing a maximum microwave output set value obtained during the rate of change in the microwave output is judged to be not zero by said microwave output variation judging section before the rate of change in the microwave output power became zero while increasing the microwave output set value by said microwave output set value variation section in a state that the regulation value is set at said microwave output setting means and a filament input value corresponding to said regulation value taking a relationship predetermined between the microwave output power and filament input; and (c-5) a microwave output difference operation section for calculating a microwave output value difference between the microwave output set value stored in said microwave output set value memory section and the microwave output regulation value stored in said microwave output regulation value memory section; and wherein said filament life diagnostic circuit judges the life of the filament of said magnetron based on said microwave output value difference.

4. The microwave generator according to claim 3 in which said filament life diagnostic circuit further comprises:

a replacement time setting section for presetting a time limit value for replacement of said magnetron;

a comparison section for comparing the life of the filament judged by said filament life diagnostic circuit with said preset time limit; and a warning section for instructing the replacement of magnetron to users when the life of the filament expired on or before the preset time limit.

* * * * *